(12) United States Patent
Chatterjee et al.

(10) Patent No.: US 12,626,757 B2
(45) Date of Patent: May 12, 2026

(54) LOW-LATENCY MULTIPLEXED PIPELINE MEMORY

(71) Applicant: QUALCOMM Incorporated, San Diego, CA (US)

(72) Inventors: Subho Chatterjee, San Diego, CA (US); Xiao Chen, San Diego, CA (US); Arun Ramamurthy, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 155 days.

(21) Appl. No.: 18/652,651

(22) Filed: May 1, 2024

(65) Prior Publication Data

US 2025/0342880 A1     Nov. 6, 2025

(51) Int. Cl.
*G11C 7/10* (2006.01)
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
See application file for complete search history.

(56) References Cited

U.S. PATENT DOCUMENTS

| | | | |
|---|---|---|---|
| 10,470,264 B1 * | 11/2019 | Luo ........................ | H05B 47/18 |
| 2004/0085835 A1 * | 5/2004 | Ahn ........................ | G11C 7/18 |
| | | | 365/200 |
| 2014/0104960 A1 * | 4/2014 | Iyer ...................... | G11C 7/1042 |
| | | | 365/189.05 |
| 2016/0093384 A1 * | 3/2016 | Lee ........................ | G11C 16/24 |
| | | | 365/185.12 |

* cited by examiner

*Primary Examiner* — Min Huang
(74) *Attorney, Agent, or Firm* — Loza & Loza, LLP

(57) ABSTRACT

A memory such as for a high-speed microprocessor cache includes a first bank of bitcells and a second bank of bitcells. The banks are read from in a pipelined fashion with respect to cycles of a system clock signal such that a first read operation to the first bank is initiated with respect to a first cycle of the system clock signal whereas a second read operation to the second bank is initiated with respect to a second cycle of the system clock that is consecutive to the first clock cycle. A multiplexer selects between latched bits from the read operations responsive to cycles of the system clock signal.

14 Claims, 8 Drawing Sheets

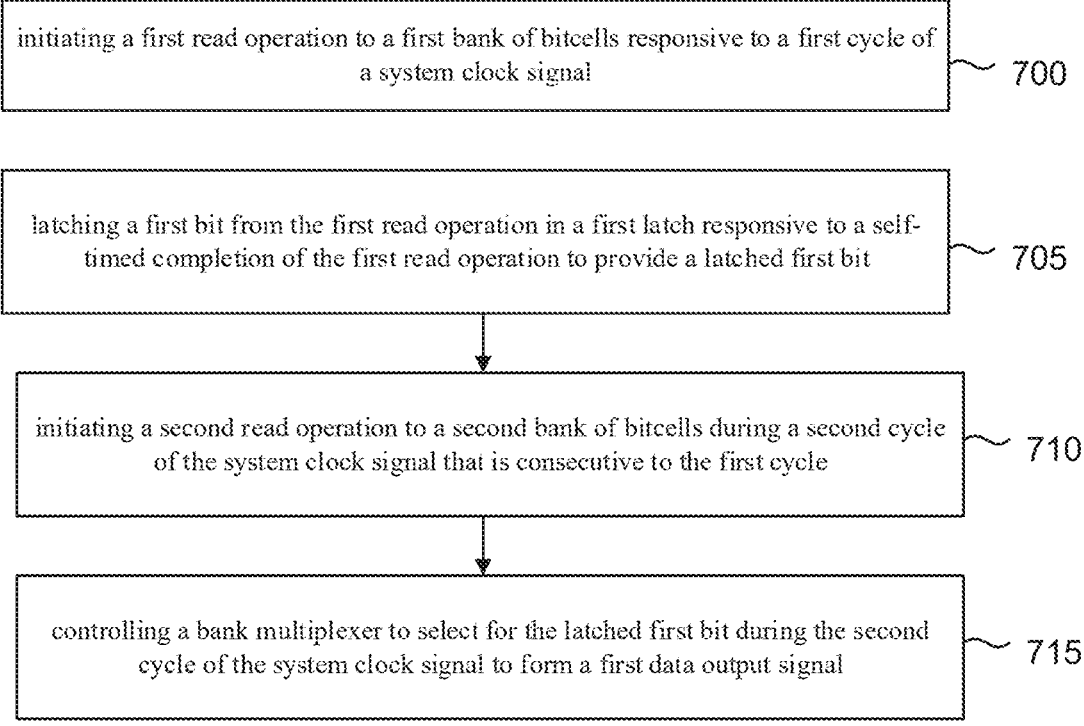

initiating a first read operation to a first bank of bitcells responsive to a first cycle of a system clock signal      ~ 700 latching a first bit from the first read operation in a first latch responsive to a self-timed completion of the first read operation to provide a latched first bit      ~ 705 initiating a second read operation to a second bank of bitcells during a second cycle of the system clock signal that is consecutive to the first cycle      ~ 710 controlling a bank multiplexer to select for the latched first bit during the second cycle of the system clock signal to form a first data output signal      ~ 715

LOW-LATENCY MULTIPLEXED PIPELINE MEMORY

TECHNICAL FIELD

The present application relates generally to memories and, more specifically, to a low-latency multiplexed pipeline memory.

BACKGROUND

As compared to dynamic random-access memory (DRAM), a static random-access memory is generally faster but more expensive as the storage of a bit in SRAM requires more transistors as compared to DRAM. The main memory of a microprocessor is thus typically a DRAM due to its lower cost. But the microprocessor processing speed would be too slow if the microprocessor had to fetch all its data and instructions from the main memory. It is therefore conventional for a microprocessor to include a variety of SRAM caches for the storing of frequently used data and instructions. Each SRAM cache includes numerous transistors that consume power through the conduction of leakage currents even while the SRAM cache is idle. In addition, a latency of the read operations to the SRAM caches can limit the microprocessor operating speed.

SUMMARY

In accordance with an aspect of the disclosure, a memory is provided that includes: a first bank of bitcells; a first latch configured to latch a first bit responsive to a first self-timed read operation to the first bank in response to a system clock signal; a second bank of bitcells; a second latch configured to latch a second bit responsive to a second self-timed read operation to the second bank in response to the system clock signal; and a bank multiplexer configured to select between a latched first bit from the first latch and a latched second bit from the second latch responsive to a bank multiplexer select signal.

In accordance with another aspect of the disclosure, a method of reading from a memory is provided that includes: initiating a first read operation to a first bank of bitcells responsive to a first cycle of a system clock signal; latching a first bit from the first read operation in a first latch responsive to a self-timed completion of the first read operation to provide a latched first bit; initiating a second read operation to a second bank of bitcells during a second cycle of the system clock signal that is consecutive to the first cycle; and controlling a bank multiplexer to select for the latched first bit during the second cycle of the system clock signal to form a first data output signal.

Finally, in accordance with yet another aspect of the disclosure, a memory is provided that includes: a first bank of bitcells; a first latch configured to latch a first bit from the first bank of bitcells responsive to a first self-timed read operation to the first bank of bitcells to provide a first latched bit; a second bank of bitcells; a second latch configured to latch a second bit from the second bank of bitcells responsive to a second self-timed read operation to the second bank of bitcells to provide a second latched bit; means for alternatively selecting between the first latched bit and the second latched bit responsive to cycles of a system clock signal such that in a first cycle of the system clock signal the means selects for the first latched bit and in second cycle of the system clock signal that is consecutive to the first cycle the means selects for the second latched bit; and an output register configured to be clocked by the system clock signal to register a data output signal from the means.

These and other advantageous features may be better appreciated through the following detailed description.

BRIEF DESCRIPTION OF THE DRAWINGS

FIG. 7 is a flowchart for an example method of reading from a pair of pipelined banks in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
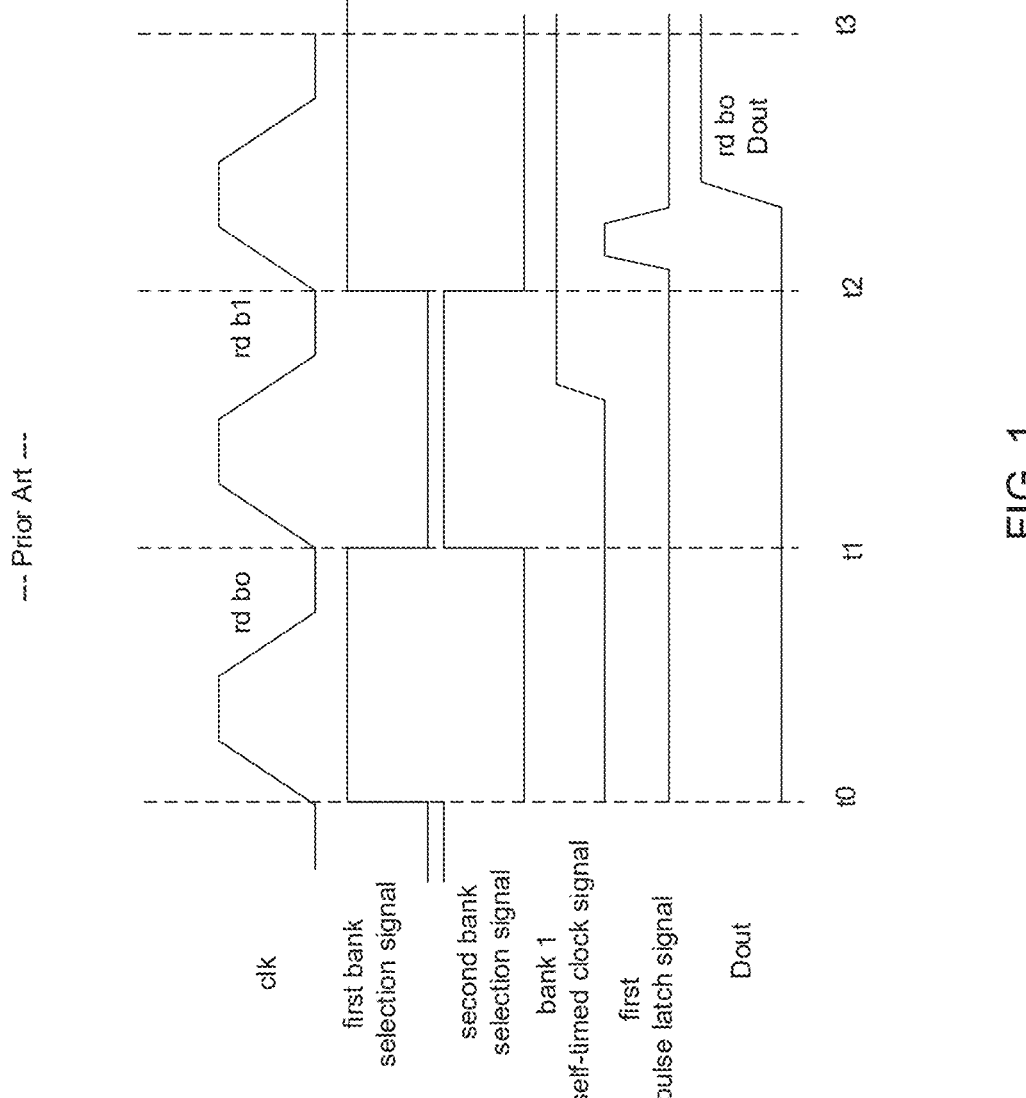
FIG. 1 is a timing diagram for a read operation to a microprocessor cache having a conventional three-cycle read operation latency.

A low-latency multiplexed pipeline memory is provided for memory applications such as a high-performance microprocessor cache. Due to its higher speed, the following discussion will be directed to an SRAM implementation of the memory, but it will be appreciated that the memory may also be implemented as a DRAM. Before the low-latency multiplexed pipeline memory is discussed in more detail, some general memory concepts will first be discussed. The bitcells for an SRAM are typically arranged into rows and columns. Each row is traversed by a corresponding word line whereas a pair of bit lines traverses each column. The word line length and the bit line length therefore both increase as the row and column size is increased. But this increased length comes at the cost of increased capacitance, which slows the memory operating speed. The bitcells are thus typically arranged into banks instead of into one large array. Each bank of bitcells has its own rows and columns. In this fashion, the capacitance for the word lines and the bit lines may be kept to a manageable level for increased memory speed.

To reduce power consumption from the conduction of leakage currents and increase memory operating speed due to pipelining of the read operations, the SRAM data storage for a high-speed microprocessor cache may be organized into a pair of banks. The microprocessor reads from the banks in an alternating fashion, first from one bank and then from the other. These reads are initiated with respect to cycles of a system clock for the microprocessor. With a read operation to a bank initiated by the system clock, the bank proceeds to perform the read operation responsive to a self-timed clock signals. For example, the word line for the accessed row in a read operation is asserted for a word line assertion period during the read operation. The word line assertion period should not be excessively long or it will slow the memory speed. Conversely, if the word line assertion period is too short, the read operation may be unsuccessful because the bit lines for the accessed column don't develop a sufficient voltage difference so that a bit may be detected. A dummy word line circuit models the word line and bit line interaction so that the word line assertion period may be terminated through a corresponding self-timed clock signal generated by the dummy word line circuit. Similarly, another dummy circuit models the sense amplifier operation so that a self-timed clock signal may be generated to denote a successful read operation. It is this self-timed clock signal that will be addressed in the following discussion. As used herein, a "self-timed read operation" will thus be understood to refer to a memory read operation as timed through a self-timed clock signal generated by the memory to denote a successful read operation to a bank. The resulting data output bit is referred to herein as a data output signal (Dout).

With these memory concepts in mind, a typical high-speed microprocessor cache will now be discussed. For example, the microprocessor initiates a read operation to a first bank in a pair of pipelined banks during a first cycle of a system clock signal. Similarly, the microprocessor initiates a read operation to a second bank in the pair of banks during a second cycle of the system clock signal. But note that the duration of the read operation to each bank is determined by a corresponding self-timed memory clock signal that is asynchronous to the system clock signal. The alternating access to the banks is thus advantageous as the memory access is pipelined. Should a self-timed read operation last longer than a period of the system clock signal, the microprocessor operating speed is not decreased because it may receive data from one bank while the other bank completes its read operation. In addition, the idle time for each bank is reduced as compared to a cache implementation with more than two banks, which reduces the conduction loss from leakage currents. The alternating read (which may be analogized to the back and forth of a ping-pong game) thus reduces power consumption from leakage currents and allows for a high-speed operation of the corresponding microprocessor.

The alternating reads to the banks occur according to corresponding bank selection signals. The pair of banks will be deemed in the following discussion to be formed by a first bank and a second bank. During a period of the system clock signal in which the first bank is to be accessed for a read operation, the microprocessor asserts a first bank selection signal. Similarly, the controller asserts a second bank selection signal during a period of the system clock signal in which the second bank is to be accessed for a read operation. As defined herein, a binary signal such as the bank selection signals is deemed to be asserted when the binary signal is logically true, regardless of whether the true state is represented according to an active-high or an active-low convention. In an active-high convention, a signal is thus deemed to be asserted when the signal is asserted to a power supply voltage. Conversely, a signal is deemed to be asserted in an active-low convention when the signal is discharged to ground.

Given the alternating access to the banks, it is traditional that the selection signal for a bank be registered in a serial chain of two clocked storage elements such as a serial chain of two flip-flops that are clocked responsive to the system clock signal. A first pair of flip-flops registers the first bank selection signal whereas a second pair of flip-flops registers the first bank selection signal. A timing diagram for the alternating read operation from the pair of banks is shown in FIG. 1. A first cycle of the system clock signal (clk) begins at a time t0 and completes at a time t1. A duration of the first cycle equals the period of the system clock signal. The period will decrease as the frequency of the system clock signal is increased and will increase at slower system clock signal frequencies. The first bank selection signal is asserted during this first cycle so that a read operation to the first bank (rd b1) is initiated at time t0. During the first cycle, a second bank selection signal to the second bank is de-asserted. For example, the second bank selection signal may be a complement of the first bank selection signal.

A second cycle of the system clock signal begins at time t1 and extends to a time t2 and again equals the period of the system clock signal. Due to the alternation of the read operations, the second bank selection signal is asserted during the second cycle whereas the first bank selection signal is de-asserted. A read operation to the second bank (rd b2) is initiated at time t1. After time t1 but before time t2, the read operation to the first bank is completed so that a bank 1 self-timed clock signal is asserted. The assertion of the first bank selection signal at time t0 is registered by a first pair of flip-flops (not illustrated) clocked by the system clock signal to trigger a first pulse latch (not illustrated) to pulse a first pulse latch signal in a third cycle of the system clock signal that lasts from time t2 to a time t3. The pulsing of the first pulse latch signal during the third clock cycle clocks a data output flip-flop (not illustrated) to latch a data output signal Dout from the bank 1 read (rd b1) that was initiated at time t1. There is a three-cycle latency from the initiation of the bank 1 read at time t0 until the data output signal Dout is available to the microprocessor. An analogous three-cycle latency occurs with respect to the initiation of a read operation to the second bank and the availability of a corresponding data output signal. The three-cycle latency slows the microprocessor operation and increases software complexity.

Figure 2:
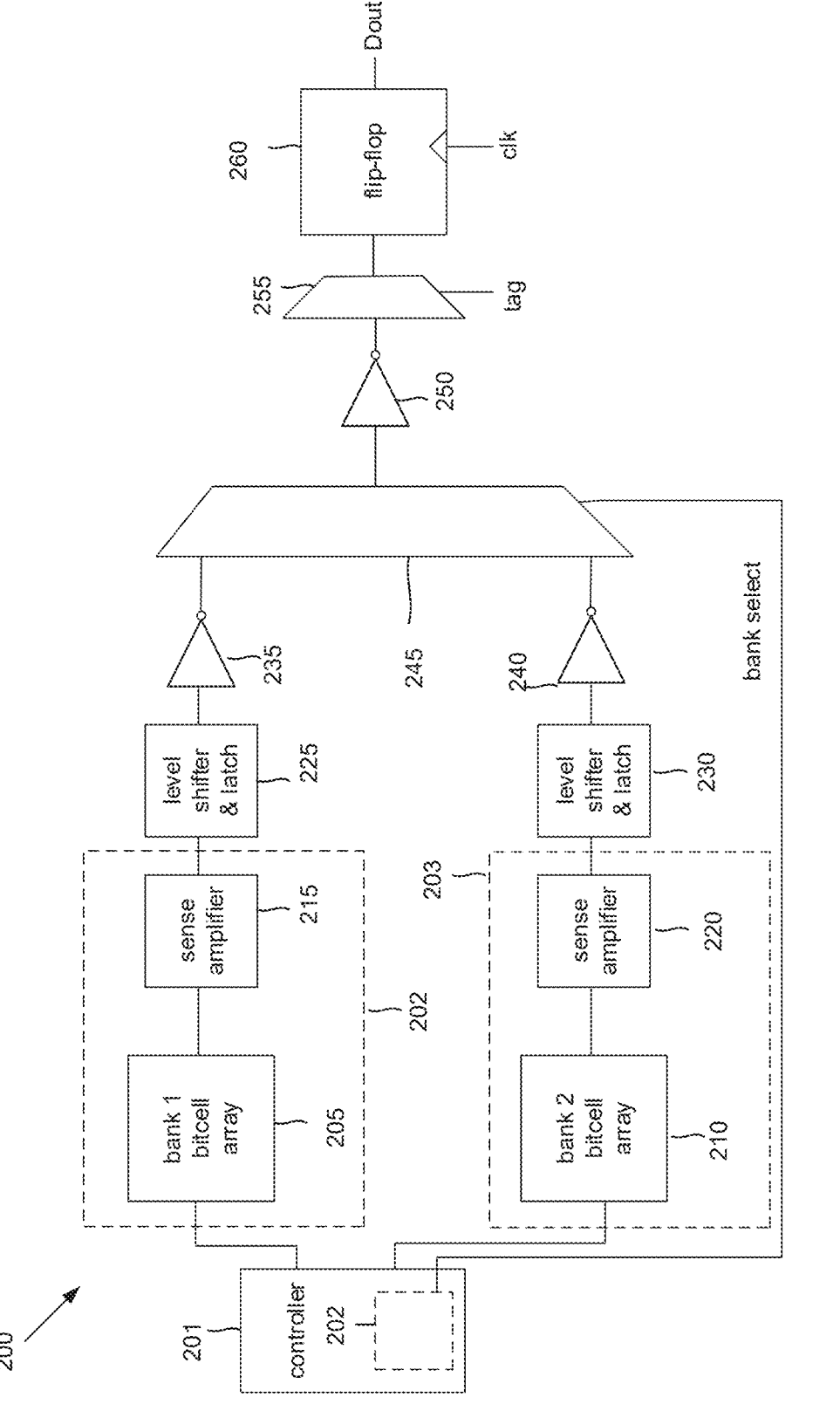
FIG. 2 is a diagram of a memory such as for a microprocessor cache having only a two-cycle read operation latency in accordance with an aspect of the disclosure.

The low-latency multiplexed pipeline memory disclosed herein such as for a high-performance microprocessor cache advantageously has only a two-cycle latency between the initiating cycle of the system clock signal and when the data output signal (Dout) from the accessed bank is available to the microprocessor. An example memory 200 is shown in FIG. 2. A controller 201 generates alternating read commands to a first bank 202 and a second bank 203. Each bank includes a bitcell array and a plurality of sense amplifiers. For illustration clarity, a single sense amplifier is illustrated for each bank. However, it will be appreciated that each bank would typically be sensed by a plurality of sense amplifiers. The first bank 202 includes a bank 1 bitcell array 205 and a sense amplifier 215. Similarly, the second bank 203 includes a bank 2 bitcell array 210 and a sense amplifier 220. A level-shifter and latch 225 latches the sensed bits from the first bank 202 and level-shifts the latched bits from the memory power domain to a core power domain for the microprocessor (not illustrated). The memory power domain is powered by the memory power supply voltage whereas the core power domain is powered by a core power supply voltage. A level-shifter and latch 230 latches the sensed bits from the second bank 203 and level-shifts the latched bits from the memory power domain to the core power domain.

The controller 201 generates a bank multiplexer select signal (also designated herein as a bank select signal) to control a bank multiplexer 245 to select for a level-shifted bit from the appropriate bank. To assist with the buffering of the selected bits, a first inverter 235 intervenes between the first bank's level-shifter and latch 225 and the bank multiplexer 245. Similarly, a second inverter 240 intervenes between the second bank's level-shifter and latch 230 and the bank multiplexer 245. A third inverter 250 at an output terminal of the bank multiplexer 245 completes the buffering started by the inverters 235 and 240. As known in the cache arts, the banks are arranged into a plurality of N ways such that the bits from the inverter 250 are selected according to a tag by a multiplexer 255, where N is a plural positive integer. A storage element such as a register 260 stores each bit from the multiplexer 255 as a data output signal (Dout). As used herein, the terms "register" and "flip-flop" are used interchangeably. The register 260 may thus also be denoted as a flip-flop 260.

The controller 201 includes a bank multiplexer select signal generator 202 for the generation of the bank multiplexer select signal. The bank multiplexer select signal generator 202 is shown in more detail in in FIG. 3. When the controller 201 of FIG. 2 addresses a read operation to the first bank, the controller 201 asserts a bank 1 select signal (B1 select). The bank multiplexer select signal generator 202 includes a first serial pair of registers such as a serial pair of an initial master slave flip-flop (FF) 310 and a final master slave flip-flop 320 that successively latch the bank 1 select signal. The system clock signal (clk) as inverted by an inverter 305 clocks the master slave flip-flop (FF) 310 and the master slave flip-flop 320. Should the bank 1 select signal be asserted in a given cycle of the system clock signal, the master slave flip-flop 310 will latch the asserted bank 1 select signal in the same cycle whereas the master slave flip-flop 320 latches the asserted bank 1 select signal in the consecutive cycle. An output terminal of the master slave flip-flop 320 couples to a first input terminal of a first logic gate such as a NAND gate 350 and couples to a second input terminal of the NAND gate 350 through a serial chain of a buffer 330 and a first inverter 335. An output signal of the NAND gate 350 will thus be pulsed for a duration of the propagation delay through the serial chain of the buffer 330 and the inverter 335 when the master slave flip-flop 320 latches the asserted bank 1 select signal. The asserted output signal from the NAND gate 350 sets a set-reset (SR) latch 360 to assert the bank multiplexer select signal. The bank multiplexer select signal will thus be asserted in the consecutive system clock signal cycle following a system clock signal cycle in which the controller 201 asserts the bank one select signal.

The controller 201 of FIG. 2 alternates the bank selection such that it alternates the assertion of the bank 1 select signal (B1 select) and a bank 2 select signal (B2 select). The bank 2 select signal may be asserted in the consecutive system clock signal cycle following a system clock signal cycle in which the controller 201 asserted the bank 1 select signal. The bank multiplexer select signal generator 202 includes a second serial pair of registers such as a serial pair of an initial master slave flip-flop (FF) 315 and a final master slave flip-flop 325 that successively latch the bank 2 select signal. The system clock signal (clk) as inverted by the inverter 305 clocks the master slave flip-flop (FF) 315 and the master slave flip-flop 325. Should the bank 2 select signal be asserted in a given cycle of the system clock signal, the master slave flip-flop 315 will thus latch the asserted bank 2 select signal in the same cycle whereas the master slave flip-flop 325 latches the asserted bank 2 select signal in the consecutive cycle. An output terminal of the master slave flip-flop 325 couples to a first input terminal of a second logic gate such as a NAND gate 355 and couples to a second input terminal of the NAND gate 355 through a serial chain of a buffer 340 and a second inverter 345. An output signal of the NAND gate 355 will then be pulsed for a duration of the propagation delay through the serial chain of the buffer 340 and the inverter 345 when the master slave flip-flop 325 latches the asserted bank 2 select signal. The assertion of the output signal from the NAND gate 355 resets the SR latch 360 to de-assert the bank multiplexer select signal. An assertion of the bank multiplexer select signal thus controls the bank multiplexer 245 (FIG. 2) to select for a level-shifted latched bit from the first bank 202 whereas a de-assertion of the bank multiplexer select signal controls the bank multiplexer 245 to select for a level-shifted latched bit from the second bank 203.

Figure 4:
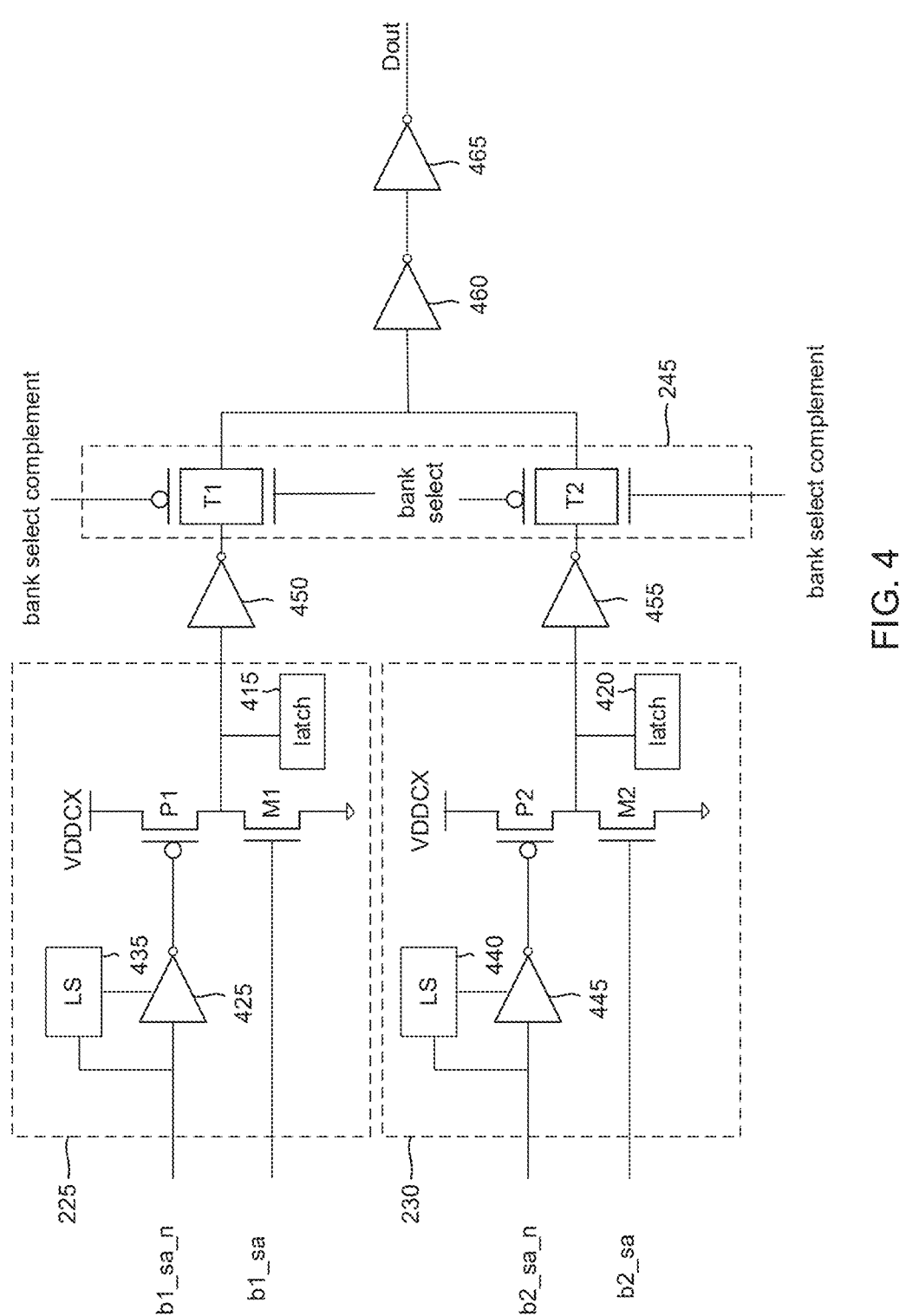
FIG. 4 is a circuit diagram of portions of the memory of FIG. 2 in accordance with an aspect of the disclosure.

The level-shifter and latch 225 for the first bank, the level-shifter and latch 230 for the second bank, and the bank multiplexer 245 are shown in a more detailed example implementation in FIG. 4. A differential output from the bank 1 sense amplifier 215 (FIG. 2) is represented by a bank 1 sense amplifier output signal b1_sa and its complement b1_sa_n. A node for the bank 1 sense amplifier output signal b1_sa couples to a gate of a first n-type metal-oxide semiconductor (NMOS) transistor M1 having a source coupled to ground. A node for the complement signal b1_sa_n couples through a first inverter 425 to a gate of a first p-type metal-oxide semiconductor (PMOS) transistor P1 having a source coupled to a node for a core domain power supply voltage VDDCX. A drain of the transistor P1 couples to a drain of the transistor M1. Should the bank 1 sense amplifier output signal be a binary one, the complement signal b1_sa_n will be a binary zero, which triggers a level-shifter 435 to power the inverter 425 with the core domain power supply voltage VDDCX. The transistor P1 is then off in response to the binary one value of the bank 1 sense amplifier output signal whereas the transistor M1 is on, which discharges the drains of the transistors P1 and M1. The discharged drain voltage is latched by a latch 415 and inverted by an inverter 450. Conversely, the transistor P1 is on and the transistor M1 is off in response to a binary zero value of the bank 1 sense amplifier output signal, which charges the drains of the transistors P1 and M1 to the core domain power supply voltage VDDCX. The charged drain voltage is again latched by the latch 415 and inverted by the inverter 450.

An output signal of the inverter 450 is gated by a transmission gate T1 in the bank multiplexer 245. The bank multiplexer select signal (bank select) controls an NMOS transistor side of the transmission gate T1 whereas a complement of the bank multiplexer select signal (bank select complement) controls a PMOS transistor side of the transmission gate T1. The transmission gate T1 will open (be switched on) to pass the output signal of the inverter 450 when the bank multiplexer select signal is asserted.

Suppose that the transmission gate T1 is open and the bank 1 sense amplifier output signal is a binary one. The output signal of the inverter 450 will then also equal a binary one and be passed by the transmission gate T1. An output signal of the transmission gate T1 may be buffered by a serial pair of inverters 460 and 465 to form the data output signal (Dout). The data output signal will thus be a binary one when the bank multiplexer select signal is asserted and the bank 1 sense amplifier output signal is asserted. Should instead the bank 1 sense amplifier output signal be a binary zero, the transistor M1 will be off. The complement signal b1_sa_n will then be a binary one, which is inverted by the inverter 425 to switch on the transistor P1. The switching on of the transistor P1 and switching off of the transistor M1 forces the output signal of the inverter 450 to be a binary zero, which is passed by the transmission gate T1 and buffered by the inverters 460 and 460 to form the data output signal as a binary zero.

The level-shifter and latch 230 for the second bank functions analogously. A differential output from the bank 2 sense amplifier 230 (FIG. 2) is represented by a bank 2 sense amplifier output signal b2_sa and its complement b2_sa_n. A node for the bank 2 sense amplifier output signal b2_sa couples to a gate of a second NMOS transistor M2 having a source coupled to ground. A node for the complement signal b2_sa_n couples through a second inverter 445 to a gate of a second PMOS transistor P2 having a source coupled to the node for the core domain power supply voltage VDDCX. A drain of the transistor P2 couples to a drain of the transistor M2. Should the bank 2 sense amplifier output signal be a binary one, the complement signal b2_sa_n will be a binary zero, which triggers a level-shifter 440 to power the inverter 445 with the core domain power supply voltage VDDCX. The transistor P2 is therefore off in response to the binary one value of the bank 2 sense amplifier output signal whereas the transistor M2 is on, which discharges the drains of the transistors P2 and M2. The discharged drain voltage is latched by a latch 420 and inverted by an inverter 455. Conversely, the transistor P2 is on and the transistor M2 is off in response to a binary zero value of the bank 2 sense amplifier output signal, which charges the drains of the transistors P2 and M2 to the core domain power supply voltage VDDCX. The charged drain voltage is again latched by the latch 420 and inverted by the inverter 455.

An output signal of the inverter 455 is gated by a transmission gate T2 in the bank multiplexer 245. The bank multiplexer select signal controls a PMOS transistor side of the transmission gate T2 whereas the complement of the bank multiplexer select signal controls an NMOS transistor side of the transmission gate T2. The transmission gate T2 will thus be open to pass the output signal of the inverter 450 when the bank multiplexer select signal is de-asserted to select for the second bank. Should the bank multiplexer select signal be de-asserted, the transmission gate T1 in the bank multiplexer 245 will be closed (switched off) whereas the transmission gate T2 is closed in response to an assertion of the bank multiplexer select signal.

Suppose that the transmission gate T2 is open and the bank 2 sense amplifier output signal is a binary one. The output signal of the inverter 455 will then also equal a binary one and be passed by the transmission gate T2. The output signal of the transmission gate T2 is buffered by the serial pair of inverters 460 and 465 to form the data output signal (Dout). The data output signal will thus be a binary one when the bank multiplexer select signal is de-asserted and the bank 2 sense amplifier output signal is asserted. Should instead the bank 2 sense amplifier output signal be a binary zero, the transistor M2 will be off. The complement signal b2_sa_n will be a binary one, which is inverted by the inverter 445 to switch on the transistor P2. The output signal of the inverter 455 will then be a binary zero, which is passed by the transmission gate T2 and buffered by the inverters 460 and 460 to form the data output signal as a binary zero.

A combination of the bank multiplexer select signal generator 202 and the bank multiplexer 245 is an example of a means for alternatively selecting between a first latched bit from the first bank and a second latched bit from the second bank responsive to cycles of the system clock signal such that in a first cycle of the system clock signal the means selects for the first latched bit and in second cycle of the system clock signal that is consecutive to the first cycle the means selects for the second latched bit.

Figure 5:
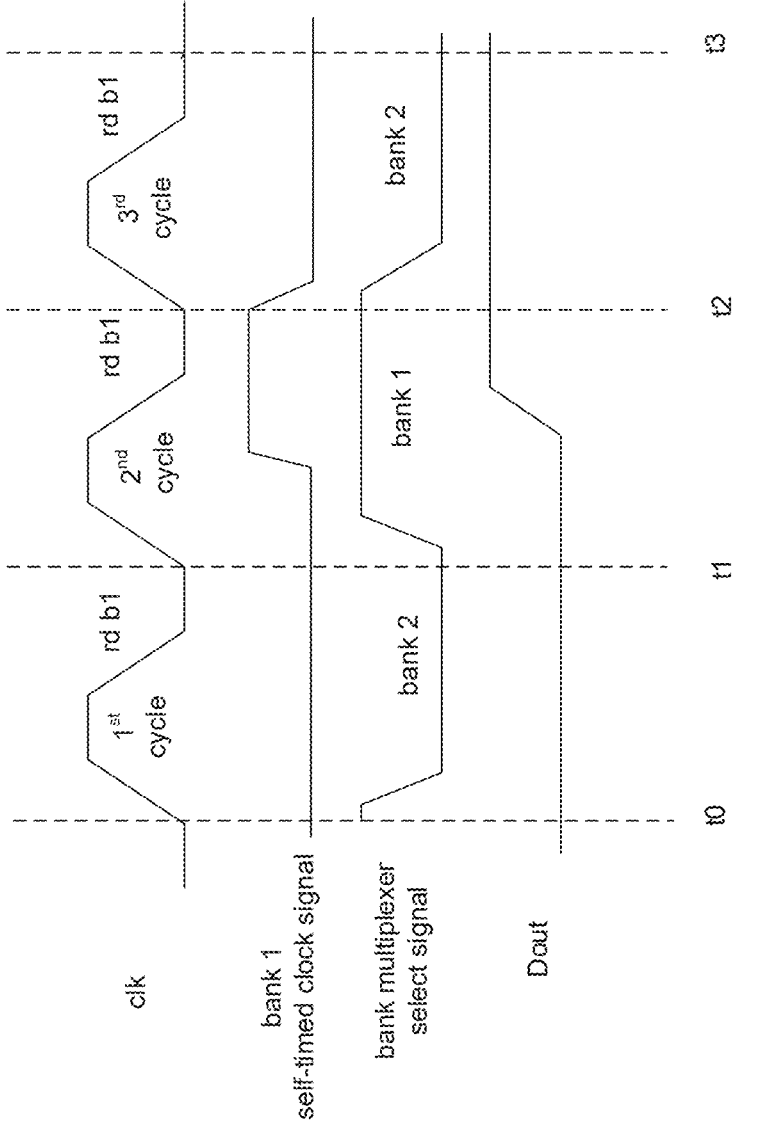
FIG. 5 is a timing diagram for an implementation of a memory which a system clock to data output signal timing is limited by a duration of the self-timed read operations to the banks in accordance with an aspect of the disclosure.

The advantageous two-cycle latency of the memory 200 with respect to the system clock signal may be better appreciated with respect to the timing diagram of FIG. 5. The two-cycle latency is achieved regardless of whether the self-timed operation of the memory is slower or faster than the bank multiplexer select signal availability as determined by the frequency of the system clock signal. A first cycle of the system clock signal (clk) begins at a time t0 and completes at a time t1. The duration of the first cycle equals the clock period of the system clock signal. As discussed with regards to FIG. 1, the system clock period will decrease as the frequency of the system clock signal is increased and will increase at slower system clock signal frequencies. A read operation to the first bank begins at time to. The bank 1 select signal (B1 select) as discussed with respect to the bank multiplexer select signal generator 202 is thus asserted at time t0. As further discussed with respect to the bank multiplexer select signal generator 202, the assertion of the bank multiplexer select signal following the assertion of the bank 1 select signal is delayed by one system clock cycle due to the clocking of the serial pair of master slave flip-flops 310 and 320. The bank multiplexer select signal is thus de-asserted during the first cycle of the system clock signal in FIG. 5 to select for the second bank.

A second cycle of the system clock signal begins at time t1 and finishes at a time t2. Due to the one-cycle delay of the bank multiplexer select signal with respect to the read operation selection of the banks, it is during the second cycle of the system clock signal that the bank multiplexer select signal is asserted to select for the first bank. At the assertion of the bank multiplexer select signal shortly after time t1, the read operation to the first bank has not yet been completed. The triggering of the sense amplifier 215 for the first bank is controlled by an assertion of a bank 1 self-timed clock signal that occurs after the assertion of the bank multiplexer select signal. With the bank 1 self-timed clock signal being asserted, the bank 1 sense amplifier signal b1_sa and its complement b1_sa_n (not shown in FIG. 5) will be driven by the sense amplifier 215 responsive to the binary value of the bit being read. Suppose that this binary value is a binary one such that the output signal of the inverter 450 of FIG. 4 is also a binary one. The transmission gate T1 will already be open so that the binary one value can pass and be registered in the register 260 of FIG. 2 as the data out signal Dout. The data out signal Dout is thus available from the memory 200 after just two system clock signals.

Figure 3:
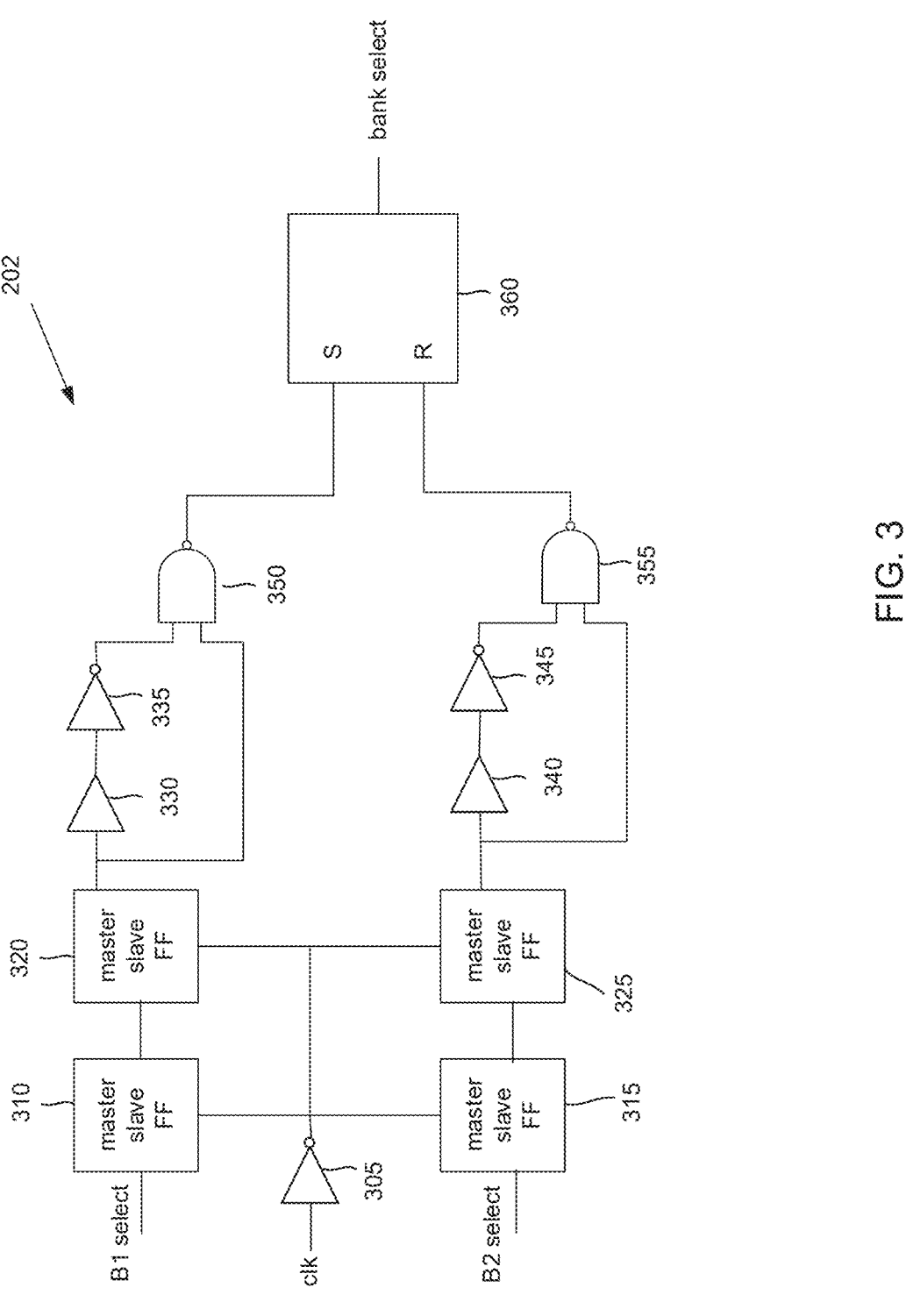
FIG. 3 is a circuit diagram of a bank multiplexer select signal generator for the memory of FIG. 2 in accordance with an aspect of the disclosure.

It may be seen that an analogous two-cycle latency is achieved for a read operation to the second bank. In that regard, the bank 2 select signal (B2 select) to the bank multiplexer select signal generator 202 of FIG. 3 is asserted following time t1 of FIG. 5. A read operation to the second bank (rd b2) begins at time t1. The data output signal Dout from this read operation (not shown in FIG. 5) will thus be registered during a third system clock signal that begins at time t2 and extends to a time t3.

With respect to the timing diagram of FIG. 5, it may be seen that the system clock to Dout timing is limited by the self-timed memory read operation. But the self-timed memory read operation may be completed prior to the assertion of the bank multiplexer select signal as shown in

Figure 6:
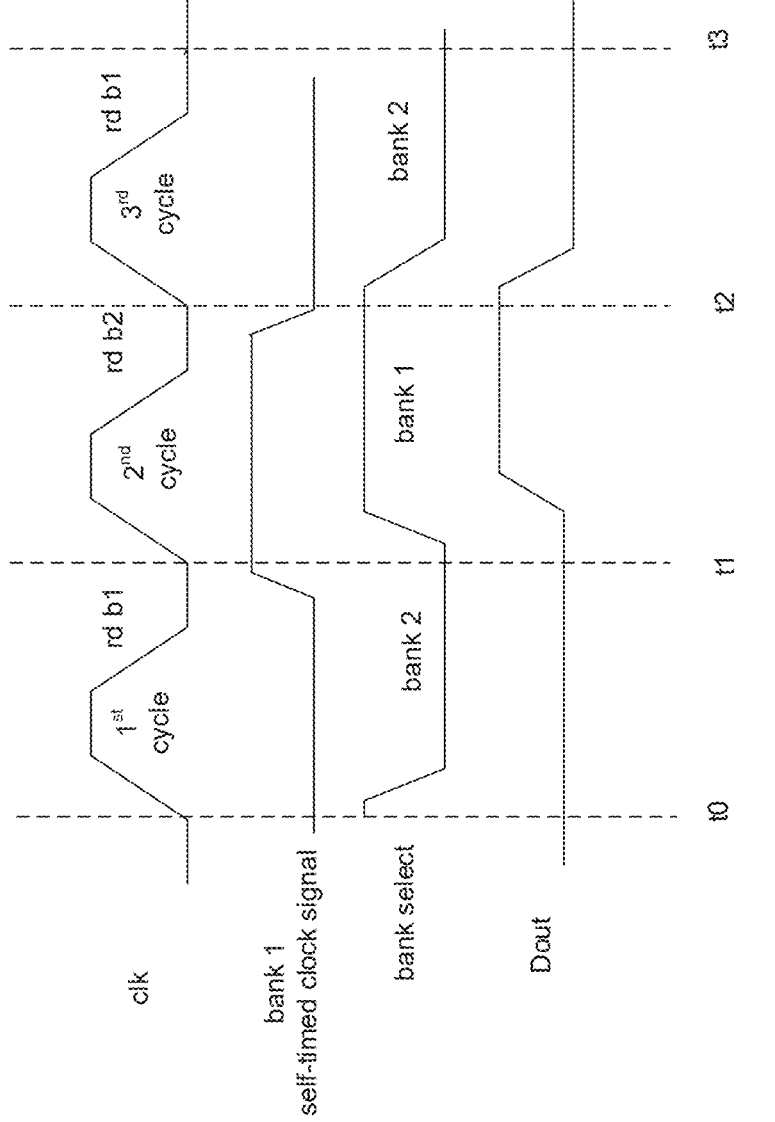
FIG. 6 is a timing diagram for an implementation of a memory which a system clock to data output signal timing is limited by the system clock signal frequency in accordance with an aspect of the disclosure.

9 the timing diagram of FIG. 6. The cycles of the system clock signal and the corresponding read operations occur in FIG. 5 as discussed with regard to FIG. 5. But the bank 1 self-timed clock signal is asserted shortly before the end of the first clock cycle in FIG. 6. The data output signal from the read operation to the first bank that begins at time to in FIG. 6 is available before the assertion of the bank multiplexer select signal shortly after time t1. The system clock to Dout timing of the timing diagram of FIG. 6 is thus limited by the frequency of the system clock as opposed to the self-timing of the read operation. A duration of the self-timed read operation to the first bank in the timing diagram of FIG. 6 is thus less than a period of the system clock signal whereas this duration is greater than the period of the system clock signal in the timing diagram of FIG. 5.

A read operation method to a memory as disclosed herein will now be discussed with respect to the flowchart of FIG. 7. The method includes an act 700 of initiating a first read operation to a first bank of bitcells responsive to a first cycle of a system clock signal. The initiating of the read operation to the first bank at time to in FIG. 5 or FIG. 6 is an example of act 700. The method also includes an act 705 of latching a first bit from the first read operation in a first latch responsive to a self-timed completion of the first read operation to provide a latched first bit. The latching in the first level-shifter and latch 225 such as at the assertion of the bank 1 self-timed clock signal of FIG. 5 or FIG. 6 is an example of act 705. In addition, the method includes an act 710 of initiating a second read operation to a second bank of bitcells during a second cycle of the system clock signal that is consecutive to the first cycle. The initiating of the read operation to the second bank at time t1 in FIG. 5 or FIG. 6 is an example of act 710. Finally, the method includes an act 715 of controlling a bank multiplexer to select for the latched first bit during the second cycle of the system clock signal to form a first data output signal. The control of the bank multiplexer 245 by the bank multiplexer control signal during the second system clock cycle of either FIG. 5 or of FIG. 6 is an example of act 715.

Figure 8:
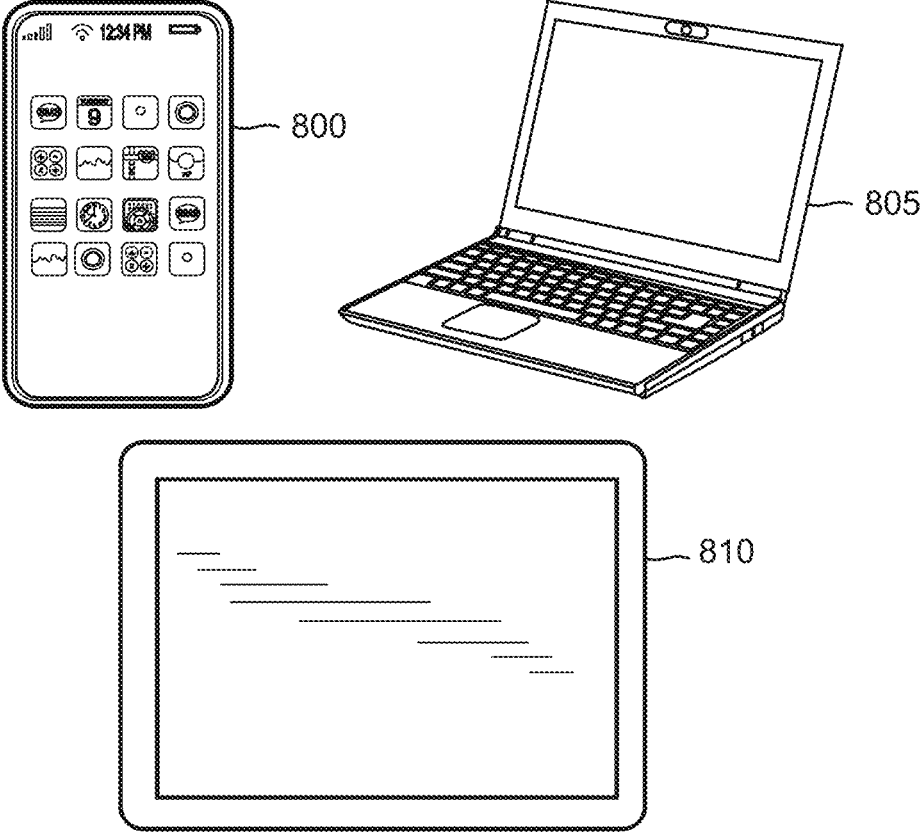
FIG. 8 illustrates some example electronic systems including a memory in accordance with an aspect of the disclosure.

A memory as disclosed herein may be incorporated in a wide variety of electronic systems. For example, as shown in FIG. 8, a cellular telephone 800, a laptop computer 805, and a tablet 810 may all include a memory in accordance with the disclosure. Other exemplary electronic systems such as a video player, a communication device, and a personal computer may also be configured with a memory constructed in accordance with the disclosure.

Some example implementations are described by the following numbered clauses:

Clause 1. A memory, comprising:
a first bank of bitcells;
a first latch configured to latch a first bit responsive to a first self-timed read operation to the first bank in response to a system clock signal;
a second bank of bitcells;
a second latch configured to latch a second bit responsive to a second self-timed read operation to the second bank in response to the system clock signal; and
a bank multiplexer configured to select between a latched first bit from the first latch and a latched second bit from the second latch responsive to a bank multiplexer select signal.

Clause 2. The memory of clause 1, further comprising:
a bank multiplexer select signal generator configured to generate the bank multiplexer select signal to control the bank multiplexer to alternate between a selection of the latched first bit from the first latch responsive to a first cycle of the system clock signal and a selection of a latched second bit from the second latch responsive to a second cycle of the system clock signal that is consecutive to the first cycle.

Clause 3. The memory of clause 2, wherein the bank multiplexer select signal is a binary signal.

Clause 4. The memory of any of clauses 2-3, wherein the bank multiplexer select signal generator comprises:
a first serial pair of registers clocked by the system clock signal to register a first bank selection signal; and
a second serial pair of registers clocked by the system clock signal to register a second bank selection signal.

Clause 5. The memory of clause 4, wherein the first serial pair of registers comprises a first serial pair of master slave flip-flops, and wherein the second serial pair of registers comprises a second serial pair of master slave flip-flops.

Clause 6. The memory of any of clauses 4-5, wherein the bank multiplexer select signal generator further comprises:
a first logic gate having a first input terminal coupled to an output terminal of a final register in the first serial pair of registers and having a second input terminal coupled though a first inverter to the output terminal of the final register in the first serial pair of registers;
a second logic gate having a first input terminal coupled to an output terminal of a final register in the second serial pair of registers and having a second input terminal coupled through a second inverter to the output terminal of the final register in the second serial pair of registers; and
a set-reset latch configured to generate the bank multiplexer select signal, the set-reset latch having a set terminal coupled to an output terminal of the first logic gate and having a reset terminal coupled to an output terminal of the second logic gate.

Clause 7. The memory of clause 6, wherein the first logic gate comprises a first NAND gate and wherein the second logic gate comprises a second NAND gate.

Clause 8. The memory of any of clauses 1-7, wherein the bank multiplexer comprises:
a first transmission gate coupled to the first latch and a second transmission gate coupled to the second latch.

Clause 9. The memory of any of clauses 1-8, wherein the first latch further comprises a first level-shifter and wherein the second latch further comprises a second level-shifter.

Clause 10. The memory of clause 9, further comprising:
a first sense amplifier coupled to the first bank of bitcells and configured to sense a first sense amplifier output signal and a complement first sense amplifier output signal during the first self-timed read operation to the first bank;
a first p-type metal-oxide semiconductor (PMOS) transistor having a source coupled to a node for a core power supply voltage;
a first n-type metal-oxide semiconductor (NMOS) transistor having a source coupled to ground, a drain coupled to a drain of the first PMOS transistor, and a gate coupled to a node for the first sense amplifier output signal; and
a first inverter coupled between a node for the complement first sense amplifier output signal and a gate of the first PMOS transistor.

Clause 11. The memory of clause 10, further comprising:
  a second sense amplifier coupled to the second bank of bitcells and configured to sense a second sense amplifier output signal and a complement second sense amplifier output signal during the second self-timed read operation to the second bank;
  a second PMOS transistor having a source coupled to the node for the core power supply voltage;
  a second NMOS transistor having a source coupled to ground, a drain coupled to a drain of the second PMOS transistor, and a gate coupled to a node for the second sense amplifier output signal; and
  a second inverter coupled between a node for the complement second sense amplifier output signal and a gate of the second PMOS transistor.
Clause 12. The memory of any of clauses 1-11, wherein the memory comprises a microprocessor cache.
Clause 13. The memory of any of clauses 1-12, wherein the memory is included within a cellular telephone.
Clause 14. A method of reading from a memory comprising:
  initiating a first read operation to a first bank of bitcells responsive to a first cycle of a system clock signal;
  latching a first bit from the first read operation in a first latch responsive to a self-timed completion of the first read operation to provide a latched first bit;
  initiating a second read operation to a second bank of bitcells during a second cycle of the system clock signal that is consecutive to the first cycle; and
  controlling a bank multiplexer to select for the latched first bit during the second cycle of the system clock signal to form a first data output signal.
Clause 15. The method of clause 14, further comprising:
  latching a second bit from the second read operation in a second latch responsive to a self-timed completion of the second read operation to provide a latched second bit; and
  controlling the bank multiplexer to select for the latched second bit during a third cycle of the system clock signal to form a second data output signal, wherein the third cycle is consecutive to the second cycle.
Clause 16. The method of any of clauses 14-15, further comprising:
  registering the first data output signal responsive to the second cycle.
Clause 17. A memory, comprising:
  a first bank of bitcells;
  a first latch configured to latch a first bit from the first bank of bitcells responsive to a first self-timed read operation to the first bank of bitcells to provide a first latched bit;
  a second bank of bitcells;
  a second latch configured to latch a second bit from the second bank of bitcells responsive to a second self-timed read operation to the second bank of bitcells to provide a second latched bit;
  means for alternatively selecting between the first latched bit and the second latched bit responsive to cycles of a system clock signal such that in a first cycle of the system clock signal the means selects for the first latched bit and in second cycle of the system clock signal that is consecutive to the first cycle the means selects for the second latched bit; and
  an output register configured to be clocked by the system clock signal to register a data output signal from the means.

Clause 18. The memory of clause 17, wherein a duration of the first self-timed read operation to the first bank of bitcells is less than a period of the system clock signal.
Clause 19. The memory of clause 17, wherein a duration of the first self-timed read operation to the first bank of bitcells is greater than a period of the system clock signal.
Clause 20. The memory of any of clauses 17-19, further comprising:
  a first inverter coupled between the first latch and the means;
  a second inverter coupled between the second latch and the means; and
  a third inverter coupled to an output terminal of the means.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:
1. A memory, comprising:
  a first bank of bitcells;
  a first latch configured to latch a first bit responsive to a first self-timed read operation to the first bank in response to a system clock signal;
  a second bank of bitcells;
  a second latch configured to latch a second bit responsive to a second self-timed read operation to the second bank in response to the system clock signal;
  a bank multiplexer configured to select between a latched first bit from the first latch and a latched second bit from the second latch responsive to a bank multiplexer select signal; and
  a bank multiplexer select signal generator configured to generate the bank multiplexer select signal to control the bank multiplexer to alternate between a selection of the latched first bit from the first latch responsive to a first cycle of the system clock signal and a selection of the latched second bit from the second latch responsive to a second cycle of the system clock signal that is consecutive to the first cycle, wherein the bank multiplexer select signal generator comprises
    a first serial pair of registers clocked by the system clock signal to register a first bank selection signal; and
    a second serial pair of registers clocked by the system clock signal to register a second bank selection signal.
2. The memory of claim 1, wherein the bank multiplexer select signal is a binary signal.
3. The memory of claim 1, wherein the first serial pair of registers comprises a first serial pair of master slave flip-flops, and wherein the second serial pair of registers comprises a second serial pair of master slave flip-flops.
4. The memory of claim 1, wherein the bank multiplexer select signal generator further comprises:
  a first logic gate having a first input terminal coupled to an output terminal of a final register in the first serial pair of registers and having a second input terminal coupled though a first inverter to the output terminal of the final register in the first serial pair of registers;

a second logic gate having a first input terminal coupled to an output terminal of a final register in the second serial pair of registers and having a second input terminal coupled through a second inverter to the output terminal of the final register in the second serial pair of registers; and a set-reset latch configured to generate the bank multiplexer select signal, the set-reset latch having a set terminal coupled to an output terminal of the first logic gate and having a reset terminal coupled to an output terminal of the second logic gate.

5. The memory of claim 4, wherein the first logic gate comprises a first NAND gate and wherein the second logic gate comprises a second NAND gate.

6. The memory of claim 1, wherein the bank multiplexer comprises:

a first transmission gate coupled to the first latch and a second transmission gate coupled to the second latch.

7. The memory of claim 1, wherein the first latch further comprises a first level-shifter and wherein the second latch further comprises a second level-shifter.

8. The memory of claim 7, further comprising:

a first sense amplifier coupled to the first bank of bitcells and configured to sense a first sense amplifier output signal and a complement first sense amplifier output signal during the first self-timed read operation to the first bank;

a first p-type metal-oxide semiconductor (PMOS) transistor having a source coupled to a node for a core power supply voltage;

a first n-type metal-oxide semiconductor (NMOS) transistor having a source coupled to ground, a drain coupled to a drain of the first PMOS transistor, and a gate coupled to a node for the first sense amplifier output signal; and a first inverter coupled between a node for the complement first sense amplifier output signal and a gate of the first PMOS transistor.

9. The memory of claim 8, further comprising:

a second sense amplifier coupled to the second bank of bitcells and configured to sense a second sense amplifier output signal and a complement second sense amplifier output signal during the second self-timed read operation to the second bank;

a second PMOS transistor having a source coupled to the node for the core power supply voltage;

a second NMOS transistor having a source coupled to ground, a drain coupled to a drain of the second PMOS transistor, and a gate coupled to a node for the second sense amplifier output signal; and a second inverter coupled between a node for the complement second sense amplifier output signal and a gate of the second PMOS transistor.

10. The memory of claim 1, wherein the memory comprises a microprocessor cache.

11. The memory of claim 1, wherein the memory is included within a cellular telephone.

12. A memory, comprising:

a first bank of bitcells;

a first latch configured to latch a first bit from the first bank of bitcells responsive to a first self-timed read operation to the first bank of bitcells to provide a first latched bit;

a second bank of bitcells;

a second latch configured to latch a second bit from the second bank of bitcells responsive to a second self-timed read operation to the second bank of bitcells to provide a second latched bit;

means for alternatively selecting between the first latched bit and the second latched bit responsive to cycles of a system clock signal such that in a first cycle of the system clock signal the means selects for the first latched bit and in second cycle of the system clock signal that is consecutive to the first cycle the means selects for the second latched bit;

an output register configured to be clocked by the system clock signal to register a data output signal from the means;

a first inverter coupled between the first latch and the means;

a second inverter coupled between the second latch and the means; and a third inverter coupled to an output terminal of the means.

13. The memory of claim 12, wherein a duration of the first self-timed read operation to the first bank of bitcells is less than a period of the system clock signal.

14. The memory of claim 12, wherein a duration of the first self-timed read operation to the first bank of bitcells is greater than a period of the system clock signal.

\* \* \* \* \*